United States Patent
Sahouria

(10) Patent No.: US 8,635,562 B2
(45) Date of Patent: Jan. 21, 2014

(54) DATA FLOW BRANCHING IN MASK DATA PREPARATION

(71) Applicant: Mentor Graphics Corporation, Wilsonville, OR (US)

(72) Inventor: Emile Sahouria, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/651,691

(22) Filed: Oct. 15, 2012

(65) Prior Publication Data

US 2013/0042213 A1 Feb. 14, 2013

Related U.S. Application Data

(63) Continuation of application No. 12/622,402, filed on Nov. 19, 2009, now abandoned.

(60) Provisional application No. 61/116,196, filed on Nov. 19, 2008.

(51) Int. Cl.
*G06F 17/50* (2006.01)

(52) U.S. Cl.
USPC .............................................. 716/50; 716/53

(58) Field of Classification Search
None
See application file for complete search history.

(56) References Cited

U.S. PATENT DOCUMENTS

| | | | | |
|---|---|---|---|---|
| 5,694,325 A | * | 12/1997 | Fukuda et al. | 700/121 |
| 6,415,421 B2 | * | 7/2002 | Anderson et al. | 716/52 |
| 6,792,592 B2 | * | 9/2004 | Keogan et al. | 716/53 |
| 6,918,100 B2 | * | 7/2005 | Kresh et al. | 716/106 |
| 7,194,328 B1 | * | 3/2007 | Haskins et al. | 700/174 |
| 7,318,214 B1 | * | 1/2008 | Prasad et al. | 716/53 |
| 7,523,429 B2 | * | 4/2009 | Kroyan et al. | 716/119 |
| 7,698,665 B2 | * | 4/2010 | Abrams et al. | 716/55 |
| 8,050,793 B1 | * | 11/2011 | Haskins et al. | 700/174 |

OTHER PUBLICATIONS

Schulze et al., "Parallel processing approaches in RET and MDP: New hybrid multithreading and distributed technology for optimum throughput in a hierarchical flow," 2003 *Proc. of SPIE*, vol. 5256, pp. 151-162.*

Kalus et al., "Elements of Hierarchical Mask Data Preparation," 2002 Proc. of SPIE, vol. 4764, pp. 76-81.*

* cited by examiner

*Primary Examiner* — Leigh Garbowski

(74) *Attorney, Agent, or Firm* — Plumsea Law Group, LLC

(57) ABSTRACT

Branching of the data-flow in a mask data preparation processes is described herein. In various implementations, the output stream from a first mask data processing operation is branched. Subsequently, the branched output stream may be connected to the input stream of a first independent mask data preparation operation and a second independent mask data preparation operation. This provides that the first and the second independent mask data preparation operations may operate in parallel. Furthermore, this provides that the first and the second independent mask data preparation operations may operate upon discrete "portions" of the data processed by the first mask data preparation operation.

16 Claims, 4 Drawing Sheets

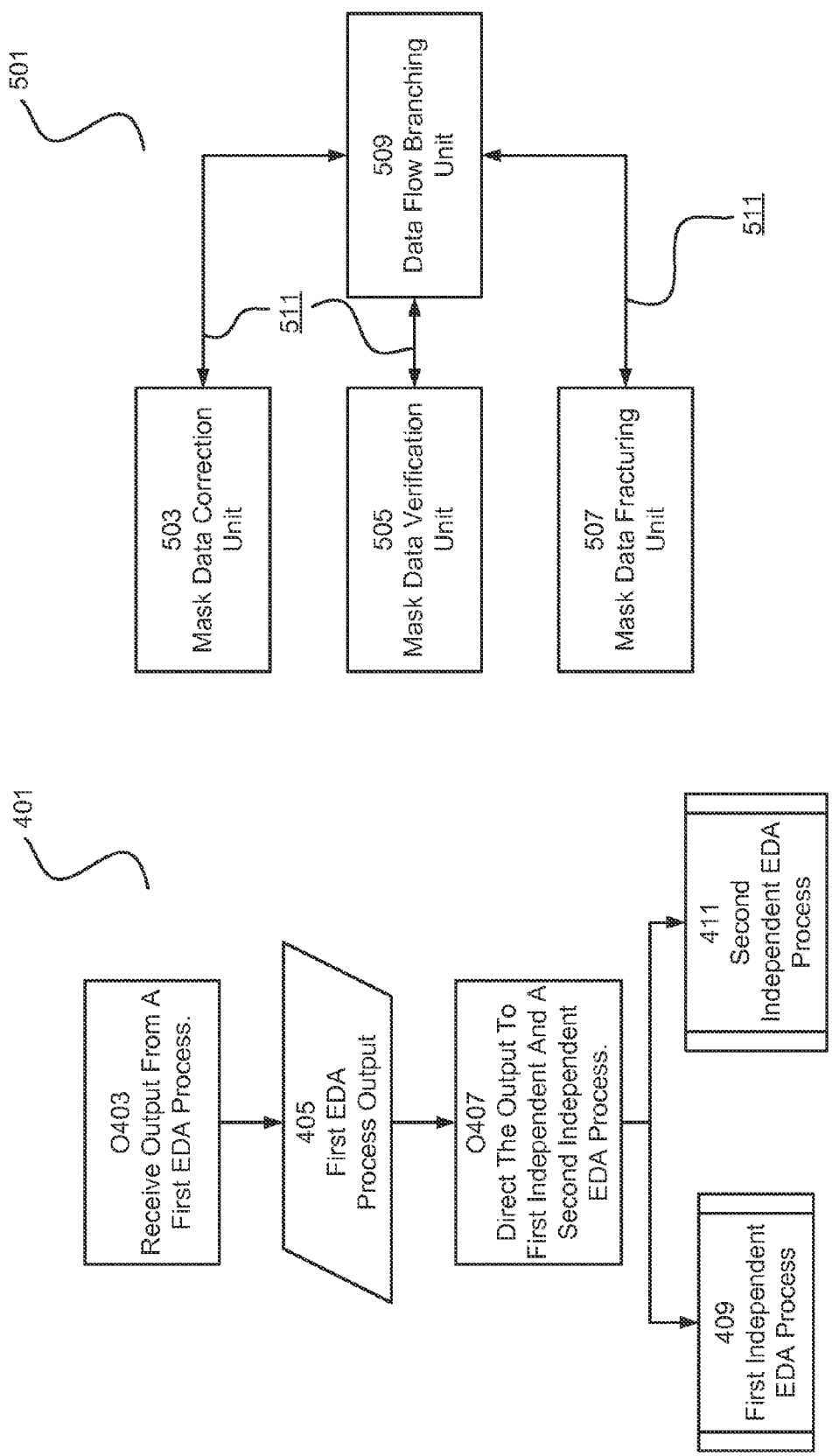

DATA FLOW BRANCHING IN MASK DATA PREPARATION

RELATED APPLICATIONS

This application is a continuation of U.S. patent application Ser. No. 12/622,402, filed on Nov. 19, 2009, which claims priority under 35 U.S.C. §119(e) to U.S. Provisional Patent Application No. 61/116,196 entitled "Data Flow Branching in Mask Data Preparation," filed on Nov. 19, 2008, and names Emile Sahouria as inventor, which application is incorporated entirely herein by reference.

FIELD OF THE INVENTION

The invention relates to the field of integrated circuit design and manufacturing. More particularly, various implementations of the invention are applicable facilitating the branching of data flows in mask data preparation processes.

BACKGROUND OF THE INVENTION

Electronic circuits, such as integrated microcircuits, are used in a variety of products, from automobiles to microwaves to personal computers. Designing and fabricating microcircuit devices typically involves many steps, sometimes referred to as the "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design. These various microcircuits are often referred to as integrated circuits (IC's).

Several steps are common to most design flows. Initially, a design may typically start at a high level of abstraction, by a designer creating a specification that describes particular desired functionality. This specification, typically implemented by a programming language, such as, for example the C or C++ programming language, describes at a high level the desired behavior of the device. Designers will then often take this specification for the design and create a logical design, often implemented in a netlist, through a synthesis process. The logical design is often referred to as a "register transfer level" (RTL) description or register transfer level design.

A register transfer level design, often implemented by a hardware description language (HDL) such as Verilog, SystemVerilog, or Very High speed hardware description language (VHDL), describes the operation of the device by defining the flow of signals or the transfer of data between various hardware components within the design. More particularly, a register transfer level design describes the interconnection and exchange of signals between hardware registers and the logical operations that are performed on those signals.

The register transfer level design is again transformed, this time into a gate level design. Gate level designs describe the actual physical components such as transistors, capacitors, and resistors as well as the interconnections between these physical components. Often, gate level designs are also implemented by a netlist, such as, for example, a mapped netlist. Lastly, the gate-level design is taken and another transformation is carried out. First by place and route tools that arrange the components described by the gate-level netlist and route connections between the arranged components; and second, by layout tools that generate a layout description having layout "shapes" that may then used to fabricate the electronic device, through for example, an optical lithographic process.

Integrated circuit layout descriptions can be provided in many different formats. The Graphic Data System II (GDSII) format is popular for transferring and archiving two-dimensional graphical IC layout data. Among other features, it contains a hierarchy of structures, each structure containing layout elements (e.g., polygons, paths or poly-lines, circles and textboxes). Other formats include an open source format named OpenAccess, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in integrated circuit layout designs that are employed to manufacture integrated circuits. Once the microcircuit device design is finalized, the layout portion of the design can be used by fabrication tools to manufacturer the device using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in layout design data define the relative locations or areas of the circuit device that will be exposed to radiation through the mask. A mask or reticle writing tool is used to create the mask based upon the layout design data, after which the mask can be used in a photolithographic process. The image embodied in the layout data is often referred to as the intended or target image or target contours, while the image created in the mask is generally referred to as the mask contours. Furthermore, the image created on the substrate by employing the mask in a photolithographic process is often referred to as the printed image or printed contours.

As designers and manufacturers continue to increase the number of circuit components in a given area and/or shrink the size of circuit components, the shapes reproduced on the substrate become smaller and are placed closer together. This reduction in feature size increases the difficulty of faithfully reproducing the image intended by the layout design onto the substrate. A principal reason for declining yields is that as feature sizes shrink, the dominant cause of defects change. At larger process technologies, yield limitation is dominated by random defects. Despite the best clean room efforts, particles still find a way to land on chips or masks, causing shorts or opens. In smaller process technologies, for example the nanometer process technology, the dominant source of yield loss is pattern-dependent effects. These defects are a result of the design's features being smaller than the wavelength of light. As a result, the physical effects of light at these smaller feature sizes must be accounted for.

Various common techniques exist for mitigating these pattern dependant effects. For example, optical process correction (OFC), phase shift masks (PSM) or other resolution enhancement techniques (RET) are commonly employed to prepare a physical layout designs for manufacturing. Additionally, physical verification techniques that assist in accounting for issues such as planarization and antenna effects are also employed on physical layout designs. Although these extensive modifications to the physical layout design resulted in a layout design that was unrecognizable by the designer, the resulting manufactured circuit matched the designer's intent.

These resolution enhancement techniques, including mask data preparation, allow for the manufacture of more modern circuits. However, there is an increased computational cost involved with including these additional processing steps into the design flow. This negatively effects the time in which finalized designs that are ready for tape out can be turned around. Historically, the design processes were viewed as serial. That is, one process was run, followed by a subsequent process, and so on until the finalized design was ready. Various prior methods have sought to parallelize these processes. However, these prior methods operate on the entire data layer. More particularly, parallel operations are not executed until the entire design is ready for the operation.

SUMMARY OF THE INVENTION

Various implementations of the present invention provide methods and apparatuses for branching the data-flow in mask data preparation processes. In various implementations of the invention, the output stream from a first mask data processing operation is branched. Subsequently, the branched output stream may be connected to the input stream of a first independent mask data preparation operation and a second independent mask data preparation operation. This provides that the first and the second independent mask data preparation operations may operate in parallel. Furthermore, this provides that the first and the second independent mask data preparation operations may operate upon discrete "portions" of the data processed by the first mask data preparation operation.

BRIEF DESCRIPTION OF THE DRAWINGS

The present invention will be described by way of illustrative embodiments shown in the accompanying drawings in which like references denote similar elements, and in which:
FIG. 4 illustrates a method of branching data in an electronic design automation process;
and
FIG. 5 illustrates a mask data preparation tool.

DETAILED DESCRIPTION OF ILLUSTRATIVE IMPLEMENTATIONS

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "determine" to describe the disclosed methods. Such terms are often high-level abstractions of the actual operations that are performed. The actual operations that correspond to these terms will often vary depending on the particular implementation, and will be readily discernible by one of ordinary skill in the art.

Furthermore, in various implementations of the invention, a mathematical model may be employed to represent an electronic device. With some implementations, a model describing the connectivity of the device, such as for example a netlist, is employed. Those of skill in the art will appreciate that the models, even mathematical models represent real world device designs and real world physical devices. Accordingly, manipulation of the model, even manipulation of the model when stored on a computer readable medium, results in a different device design. More particularly, manipulation of the model results in a transformation of the corresponding physical design and any physical device rendered or manufactured by the device design. Additionally, those of skill in the art can appreciate that during many electronic design and verification processes, the response of a devices design to various signals or inputs is simulated. This simulated response corresponds to the actual physical response the device being modeled would have to these various signals or inputs.

Some of the methods described herein can be implemented by software stored on a computer readable storage medium, or executed on a computer. Accordingly, some of the disclosed methods may be implemented as part of a computer implemented electronic design automation (EDA) tool. The selected methods could be executed on a single computer or a computer networked with another computer or computers. For clarity, only those aspects of the software germane to these disclosed methods are described; product details well known in the art are omitted.

Illustrative Computing Environment

Figure 1:
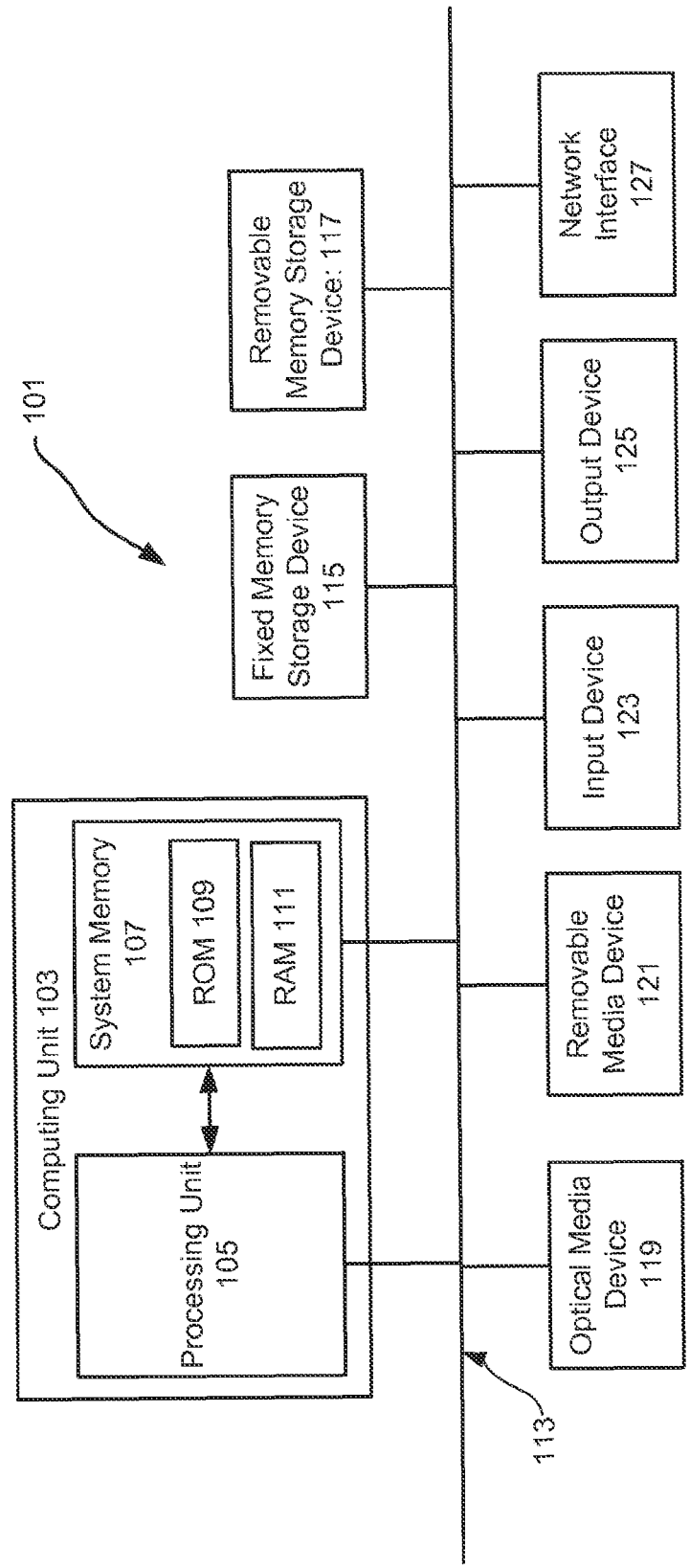
FIG. 1 shows an illustrative computing environment.

As the techniques of the present invention may be implemented using software instructions, the components and operation of a generic programmable computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device far executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Illustrative Mask Data

In a photolithographic process, as explained above, electromagnetic radiation is transmitted through selectively transparent areas of a mask. The radiation passing through these transparent areas then irradiates desired portions of a photoresistive material on a layer of semiconductor substrate. The mask in turn is created from layout design data describing the geometric features that should be manufactured on the semiconductor substrate, by way of the photolithographic process, in order to create the desired circuit. For example, if a transistor should have a rectangular gate region, then the layout design data will include a rectangle defining that gate region. This rectangle in the layout design data is then implemented in a mask for "printing" the rectangular gate region onto the substrate.

Figure 2:
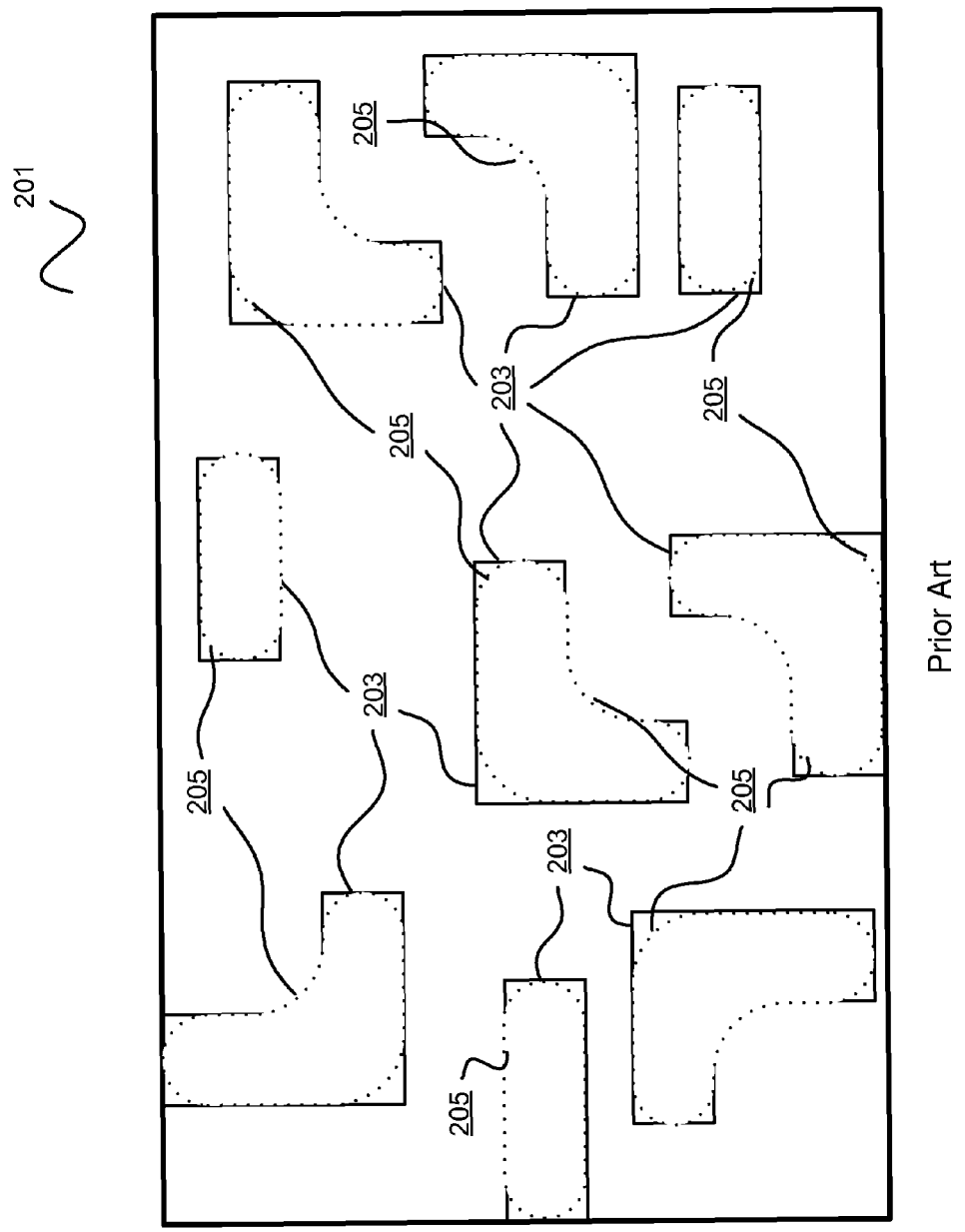
FIG. 2 illustrates a mask design.

For example, FIG. 2 illustrates a mask design 201 having shapes 203 defined therein. As described above, radiation passes though transparent areas of a mask, such as for example the areas defined by the shapes 203, causing the shapes formed by the transparent areas to be manufactured on a substrate. As the features embodied in the mask are printed however, optical effects, such as diffractive effects, will prevent certain shapes or combinations of shapes defined by the mask from being faithfully imaged onto the substrate. For example, during an optical lithographic process, the shapes 205 as opposed to the shapes 203 may be realized on the substrate. As the mask shapes become smaller relative to the wavelength of radiation used in the optical lithographic process, these distortions become more pronounced.

Figure 3:
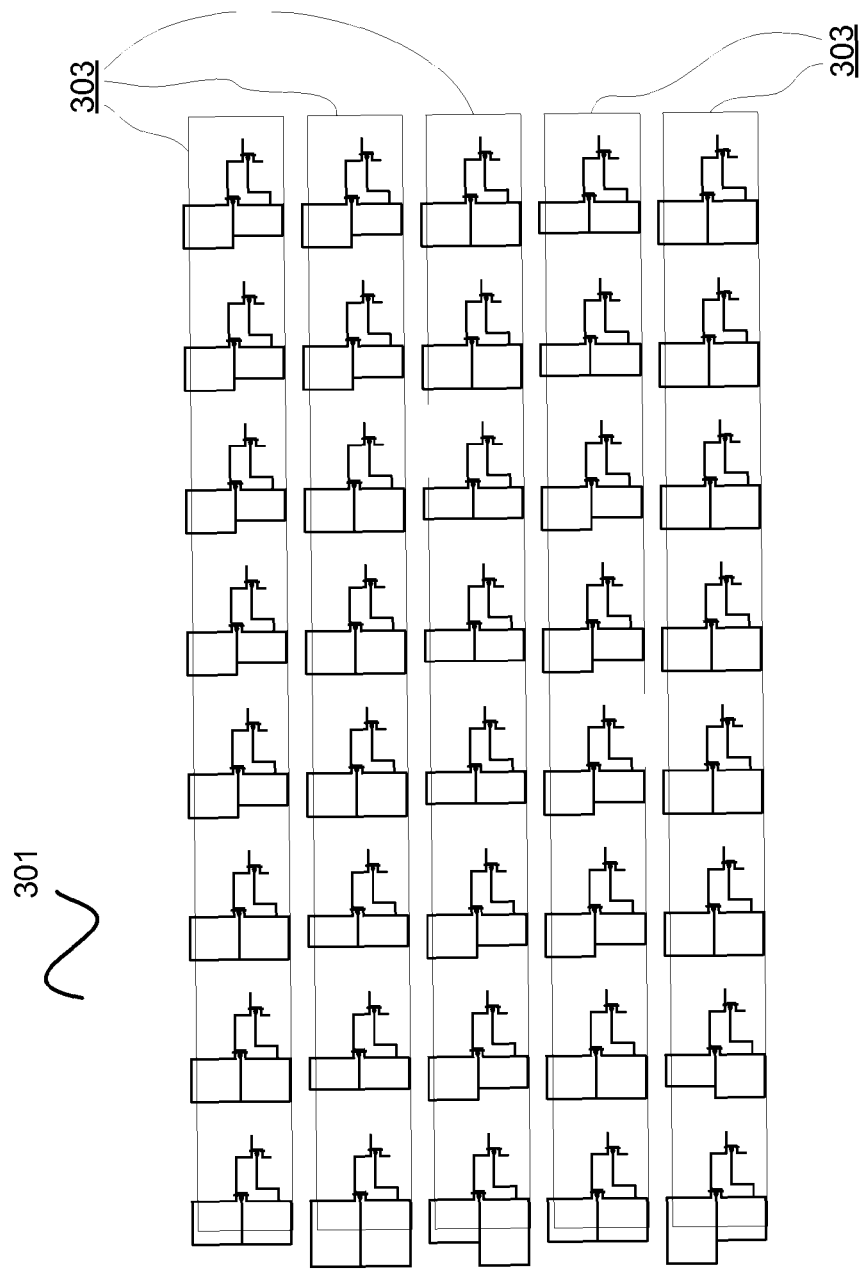
FIG. 3 illustrates a hierarchical layout design.

As a result of this, a mask design is often pre-processed, wherein the shapes are modified such that the resulting printed image will more closely match the intended or target image. This process is often referred to as mask data preparation. During mask data preparation, it is often desirable to pre-process or modify selected areas of a mask individually. Accordingly, mask data may be flattened. FIG. 3 illustrates a mask design 301, having been partitioned into sections 303. Furthermore, the sections 303 may be flattened into "cells," meaning a hierarchy of like sections. Hierarchical layout processing techniques, including mask data preparation, are further discussed in U.S. patent application Ser. No. 10/404, 907, entitled "Hierarchical Evaluation of Cells," granted on Jul. 12, 2005 to Kobi Kresh et al., which patent is incorporated entirely herein by reference.

Data-Flow Branching for Mask Data Preparation

FIG. 4 illustrates a method 401 of data-flow branching in an electronic design automation process. As can be seen from this figure, the method 401 includes an operation 403 for receiving an output (i.e. the first electronic design automation process output 405) from a first electronic design automation process. Subsequently, the method 401 includes an operation 407 for directing the first electronic design automation process output 405 to a first independent electronic design automation process 409 and a second independent electronic design automation process 411. With various implementations, the first independent electronic design automation process 409 is a mask correction verification process and the second independent electronic design automation process 411 is a mask design fracturing process.

In various implementations of the invention, the first electronic design automation process is a mask data correction process. With further implementations, the first electronic design automation process is a mask data correction process, which adjusts sections of the mask data based upon a rule deck, such as, for example an SVRF rule deck. In still further implementations, the first electronic design automation process is a mask data correction process, which partitions, and flattens the partitioned layout design prior to correction. This is often referred to as "section-mode" processing.

As indicated, section-mode processing involves executing an embedded rule deck, such as, for example an SVRF rule deck, on geographical sections of a chip. These geographical sections, which are often rectangular, have the hierarchy that lies under the geographical sections flattened to the top level. These flattened sections often include a buffer region. During section-mode processing, boundary processing may be used to reject inappropriate results in the buffer region. After which, the geographical section is then passed to the "output channel" of first electronic design automation process, and received by the operation 403. Accordingly, with some implementations, the first electronic design automation process output 405 is a geographical section of a mask design. In further implementations, the first electronic design automation process output 405 is a hierarchical geographic section of a mask design.

Mask Data Preparation Tool

FIG. 5 illustrates a mask data preparation tool 501 that may be implemented according to various examples of the invention. As can be seen from this figure, the tool 501 includes a mask data correction unit 503, a mask data verification unit 505, a mask data fracturing unit 507, and a data flow branching unit 509. In various implementations of the invention, the mask data correction unit 503 is configured to process and adjust mask data based upon a rule deck. Furthermore, the mask data correction unit 503 may be configured to partition and flatten a mask design into hierarchical geographic sections prior to processing. The mask data verification unit 505 is configured to verify that the corrected mask data (i.e. the output from the mask data correction unit) complies with various design rule constraints and that the corrected mask data corresponds to the intended design layout data. The mask data fracturing unit 507 is configured to convert and format the corrected mask data into geometric shapes, such as for example trapezoids, suitable for the intended mask writer.

As can be further seen from FIG. 5, the mask data correction unit 503, the mask data verification unit 505 and the mask data fracturing unit 507 are all individually connected to the data flow branching unit 509 via the buses 511. The buses 511 provide for the transfer of geographical sections, such as, for example via data pipelining methods, between the illustrated units. Furthermore, in various implementations, the buses 511 may provide for the signaling between units. For example, to inform the units 505 or 507 that outputs are available from the unit 503.

CONCLUSION

As described above, various implementations of the invention provide for branching the data-flow in a mask data preparation process. In various implementations of the invention, the output stream from a first mask data processing operation is branched. Subsequently, the branched output stream may be connected to the input stream of a first independent mask data preparation operation and a second independent mask data preparation operation. This provides that the first and the second independent mask data preparation operations may operate in parallel. Furthermore, this provides that the first and the second independent mask data preparation operations may operate upon discrete "portions" of the data processed by the first mask data preparation operation.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A computer-implemented method for branching the data-flow in an electronic design automation process comprising:
   receiving an output from a first operation in an electronic design automation process;
   storing the output onto one or more tangible memory storage media; and
   directing the output to a first independent operation and a second independent operation in the electronic design automation process simultaneously,
   wherein the first independent operation is a mask correction verification operation, and the second independent operation is a mask fracturing operation.

2. The computer-implemented method recited in claim 1, wherein:
   the electronic design automation process is a lithographic mask data preparation process;
   the first operation is a mask correction operation; and
   the output is a plurality of geographical sections from a grid-based layout design.

3. The computer-implemented method recited in claim 1, further comprising:
   receiving a first independent output from the first independent operation; and
   saving the first independent output onto one or more tangible memory storage media.

4. The computer-implemented method recited in claim 1, further comprising:
   receiving a second independent output from the second independent operation; and
   saving the second independent output onto one or more tangible memory storage media.

5. The computer-implemented method recited in claim 1, wherein the output is cells from a hierarchical layout design.

6. A computer-implemented method for branching the data-flow in a mask data preparation process comprising:
   using a computer system to identify an output from a mask process correction operation; and
   routing the output simultaneously to a first mask data preparation operation and a second mask data preparation operation, the first and second mask data preparation operations being different operations in a design flow.

7. The computer-implemented method recited in claim 6, wherein the output includes one or more of a plurality of modified sections of a mask design.

8. The computer-implemented method recited in claim 7, wherein the first mask data preparation operation is a mask fracturing operation, and the second mask data preparation operation is a mask correction verification operation.

9. The computer-implemented method recited in claim 8, further comprising signaling that the output is available from the mask process correction operation.

10. The computer-implemented method recited in claim 9, wherein the mask process correction operation comprises:
    partitioning the mask design into the plurality of sections;
    flattening the plurality of sections into a plurality of top level sections based upon hierarchy;
    making adjustments to ones of the plurality of top level sections based upon a mask process correction rule deck; and
    outputting the adjusted ones of the plurality of top level sections to the output.

11. The computer-implemented method recited in claim 10, wherein the mask process correction operation further comprises saving the adjusted ones of the plurality of top level sections to one or more memory storage media.

12. One or more tangible computer-readable media, having computer executable instructions for branching the data-flow in a mask data preparation process stored thereon, the computer executable instructions comprise:
    causing a computer to perform a set of operations; and
    wherein the set of operations include:
       identifying an output from a mask process correction operation; and
       routing the output simultaneously to a mask fracturing operation and a mask correction verification operation.

13. The one or more tangible computer-readable media recited in claim 12, wherein the output includes one or more of a plurality of modified sections of a mask design.

14. The one or more tangible computer-readable media recited in claim 13, the set of operations further comprising signaling that the output is available from the mask process creation operation.

15. The one or more tangible computer-readable media recited in claim 14, wherein the mask process correction operation comprises:
- partitioning the mask design into the plurality of sections;
- flattening the plurality of sections into a plurality of top level sections based upon hierarchy;
- making adjustments to ones of the plurality of top level sections based upon a mask process correction rule deck; and
- outputting the adjusted ones of the plurality of top level sections to the output.

16. The one or more tangible computer-readable media recited in claim 14, wherein the mask process correction operation further comprises saving the adjusted ones of the plurality of top level sections to one or more memory storage media.

\* \* \* \* \*